(12) United States Patent
Kakamu

(10) Patent No.: US 6,211,570 B1
(45) Date of Patent: Apr. 3, 2001

(54) SEMICONDUCTOR DEVICE HAVING A MULTILAYER INTERCONNECTION STRUCTURE

(75) Inventor: Katsumi Kakamu, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/383,203

(22) Filed: Aug. 26, 1999

(30) Foreign Application Priority Data

Dec. 2, 1998 (JP) .................................. 10-343317

(51) Int. Cl.[7] .......................... H01L 23/48; H01L 23/52; H01L 29/40
(52) U.S. Cl. .......................... 257/760; 252/797; 252/750; 252/758; 252/752
(58) Field of Search ..................... 257/760, 797, 257/750, 758, 752

(56) References Cited

U.S. PATENT DOCUMENTS

| 5,607,880 | * | 3/1997 | Suzuki et al. | 438/624 |
| 5,665,643 | * | 9/1997 | Shin | 438/763 |
| 5,716,890 | * | 2/1998 | Yao | 438/624 |
| 5,753,564 | * | 5/1998 | Fukada | 438/288 |
| 5,804,498 | * | 9/1998 | Jang et al. | 438/624 |
| 5,872,066 | * | 2/1999 | Fang et al. | 438/787 |
| 6,103,601 | * | 8/2000 | Lee et al. | 438/513 |

FOREIGN PATENT DOCUMENTS

| 0469401 | * | 7/1991 | (EP) . |
| 62-193265 | * | 8/1987 | (JP) . |
| 5-55391 | * | 3/1993 | (JP) . |
| 5-82509 | * | 4/1993 | (JP) . |
| 8-124910 |  | 5/1996 | (JP) . |
| 8-148562 |  | 6/1996 | (JP) . |

* cited by examiner

Primary Examiner—Eddie C. Lee
Assistant Examiner—Jhihan B. Clark
(74) Attorney, Agent, or Firm—Armstrong, Westerman, Hattori, McLeland & Naughton LLP

(57) ABSTRACT

A semiconductor device includes a F-doped interlayer insulation film and a high-refractive index insulation film having a refractive index higher than a refractive index of the F-doped interlayer insulation film, such that the high-refractive index insulation film is disposed at least one of a top side and a bottom side of the F-doped interlayer insulation film.

7 Claims, 11 Drawing Sheets

FIG.3

| EXP No. | Cap Layer 14 PE-SiH4 SiO2 | High R.I PE-SiH4 SiO2 | PE-TEOS SiO2 | PE-SiON | As deposited | Post 30min | Post 90min | Post 180min |
|---|---|---|---|---|---|---|---|---|
| A | R.I=1.46, 100nm | – | – | – | Not detect |  | Not detect | Peeling |
| B | – | R.I=1.49, 100nm | – | – | Not detect | – | Not detect | Not detect |
| C | – | R.I=1.51, 100nm | – | – | Not detect | – | Not detect | Not detect |
| D | – | – | R.I=1.46, 100nm | – | Not detect | Peeling | Peeling | – |
| E | – | – | R.I=1.46, 200nm | – | Not detect | Peeling | Peeling | – |
| F | – | – | R.I=1.46, 300nm | – | Not detect | Peeling | Peeling | – |
| G | – | – | R.I=1.46, 400nm | – | Not detect | – | Peeling | – |
| H | – | – | R.I=1.46, 200nm | R.I=1.58, 50nm | Not detect | – | Peeling | – |
| I | – | – | R.I=1.46, 200nm | R.I=1.58, 100nm | Not detect | – | Peeling | – |
| J | R.I=1.46, 200nm | – | – | R.I=1.65, 100nm | Not detect | – | Not detect | Peeling |
| K | – | – | R.I=1.46, 200nm | R.I=1.65, 50nm | Not detect | Peeling | – | – |
| L | – | – | R.I=1.46, 200nm | R.I=1.65, 100nm | Not detect | Peeling | – | – |

*400C, N2 anneal

FIG.5

| EXP No. | Under Layer | Cap Layer | As deposited | Post 90min | Post 180min |
|---|---|---|---|---|---|
| M | USG 500nm(R.I=1.46) | PE-SiN 30nm(R.I=2.00) | Not detect | Peeling | Peeling |
| N | USG 500nm(R.I=1.46) | High R.I SiO₂ 100nm+PE-SiN 30nm | Not detect | Not detect | Not detect |
| O | PE-SiN 30nm | PE-SiN 30nm | Not detect | Not detect | Not detect |

*400C, N₂ anneal

SEMICONDUCTOR DEVICE HAVING A MULTILAYER INTERCONNECTION STRUCTURE

BACKGROUND OF THE INVENTION

The present invention generally relates to semiconductor devices and more particularly to a semiconductor device having a low-dielectric interlayer insulation film suitable for high-speed operation, and a fabrication process thereof.

In a semiconductor integrated circuit in which a number of active device elements, such as MOS transistors, are integrated on a common substrate, it is practiced to provide a multilayer interconnection structure for electrically interconnecting these active device elements. In a multilayer interconnection structure, a first-layer interconnection pattern is covered by a first-layer interlayer insulation film, and a second-layer interconnection pattern is provided on such a first-layer interlayer insulation film. Further, a second-layer interlayer insulation film covers the second-layer interconnection pattern thus formed on the first-layer interlayer insulation film. Further, there may be a third-layer interconnection pattern and a third-layer interlayer insulation film on the second-layer interlayer insulation film.

When such a multilayer interconnection structure is to be formed in a high-speed semiconductor integrated circuit such as a logic integrated circuit or a high-speed memory integrated circuit, it is desirable to reduce the dielectric constant of the insulation film constituting the interlayer insulation film as low as possible. This demand is particularly acute in the ultrafine semiconductor integrated circuits fabricated according to the design rule of 0.3 $\mu$m or stricter. It should be noted that such ultrafine semiconductor integrated circuits generally use four or more layers for the multilayer interconnection structure and the total length of the interconnection patterns therein inevitably becomes a very large value.

When a conventional insulation film such as $SiO_2$, which is formed by a parallel-plate plasma CVD process or by a high-temperature CVD process, or an SOG film which is formed by a spin-coating process, is to be used for the interlayer insulation film in such a multilayer interconnection structure, there arises a problem of increase in the impedance as a result of the electrostatic inductance between the interconnection patterns. It should be noted that such an increase in the impedance leads to the problems of response delay or increase of electrical power consumption.

In view of the shortcomings of the conventional interlayer insulation films, there has been a proposal to deposit a F-doped, low-dielectric $SiO_2$ film by a high-density plasma CVD process. The F-doped $SiO_2$ film thus deposited may be subjected to a chemical mechanical polishing (CMP) process for planarization. In fact, it is possible to reduce the dielectric constant of the interlayer insulation film to 3.4–3.5 by adding F (fluorine) to the $SiO_2$ interlayer insulation film.

FIGS. 1A and 1B show typical examples of conventional multilayer interconnection structure.

Referring to FIG. 1A showing an example multilayer interconnection structure 10A, it can be seen that the multilayer interconnection structure 10A is formed on a substrate 1 in which active device elements such as transistors are formed. The substrate 1 further includes an interlayer insulation film covering the foregoing active devices.

On the substrate 1, there is formed an interconnection pattern 2 of Al or an Al-alloy, and an $SiO_2$ film 3 is formed on the substrate 1 typically by a plasma CVD process so as to cover the interconnection pattern 2 in conformity with the shape thereof. Further, there is formed a planarization film 4 typically of SOG, such that the planarization film 4 covers the $SiO_2$ film 3 with a planarized top surface, and an $SiO_2$ film 5 is formed on the planarization film 4 by a plasma CVD process.

In the example of FIG. 1B showing a multilayer interconnection structure 10B, on the other hand, the interconnection pattern 2 on the substrate 1 is covered by a planarized interlayer insulation film 6 of $SiO_2$ formed by a high-density plasma CVD process, wherein the planarized interlayer insulation film 6 has a planarized top surface. Further, the planarized interlayer insulation film 6 is covered by an $SiO_2$ film 7 formed by a plasma CVD process.

In any of the multilayer interconnection structures 10A and 10B of FIGS. 1A and 1B, the $SiO_2$ film 5 or the $SiO_2$ film 7 is covered by a passivation film of SiN.

In any of the conventional multilayer interconnection structures, the $SiO_2$ film 3, 4 or 6 generally has a dielectric constant of 4.1 or more. Thus, due to the effect of the stray capacitance, the problem of signal transmission delay appears conspicuously when the $SiO_2$ film 3, 4 or 6 is used for the interlayer insulation film of ultra-fine semiconductor devices that are fabricated according to the submicron rules. Further, there arises a difficulty in increasing the clock speed in such ultra-fine semiconductor devices that uses the interlayer insulation film having a dielectric constant of 4.1 or more.

As noted already, it is possible to reduce the dielectric constant of the interlayer insulation film 3, 4 or 6 to the value of 3.4–3.5 by using $SiO_2$ added with F. By using such a F-doped $SiO_2$ film for the interlayer insulation film, it becomes possible to increase the operational speed of the ultra-fine semiconductor devices. However, such a F-doped $SiO_2$ film has a drawback in that the adhesion of the $SiO_2$ film to the interconnection pattern is insufficient and that the F-doped $SiO_2$ film thus formed tends to cause an exfoliation.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having a multilayer interconnection structure using therein a low-dielectric interlayer insulation film of F-doped $SiO_2$, wherein the adhesion of the F-doped $SiO_2$ interlayer insulation film is improved substantially and also the reliability of the semiconductor device.

Another object of the present invention is to provide a semiconductor device, comprising:

a substrate;

a multilayer interconnection structure formed on said substrate;

said multilayer interconnection structure comprising: an interconnection pattern; a F-doped interlayer insulation film covering said interconnection pattern; and a high-refractive index insulation film having a refractive index higher than a refractive index of said F-doped interlayer insulation film, said high-refractive index insulation film being disposed at least one of a top side and a bottom side of said F-doped interlayer insulation film.

Another object of the present invention is to provide a fabrication process of a semiconductor device having a multilayer interconnection structure, comprising the steps of:

covering an interconnection pattern with an interlayer insulation film containing therein F and having a first refractive index; and forming a high-refractive insulation film on said interlayer insulation film, said high-refractive insulation film having a second refractive index higher than said first refractive index.

According to the present invention, the F ions released from the low-dielectric interlayer insulation film are absorbed by the high-refractive index insulation film that contains an excess amount of Si, by providing the high-refractive index insulation film adjacent to the F-containing, low-dielectric interlayer insulation film. Thereby, the problem of exfoliation of the low-dielectric interlayer insulation film is effectively suppressed.

Other objects and further features of the present invention will become apparent from the detailed description hereinafter when read in conjunction with the attached drawings.

BRIEF DESCRIPTION OF THE DRAWINGS

FIG. 3 is a diagram showing the result of the experiments in the form of a table;

FIG. 5 is a diagram showing the result of the experiments conducted on the test piece of FIG. 4;

DETAILED DESCRIPTION OF THE PREFERRED EMBODIMENTS

PRINCIPLE

Hereinafter, the principle of the present invention will be described with reference to FIGS. 2–5.

Figure 1A:
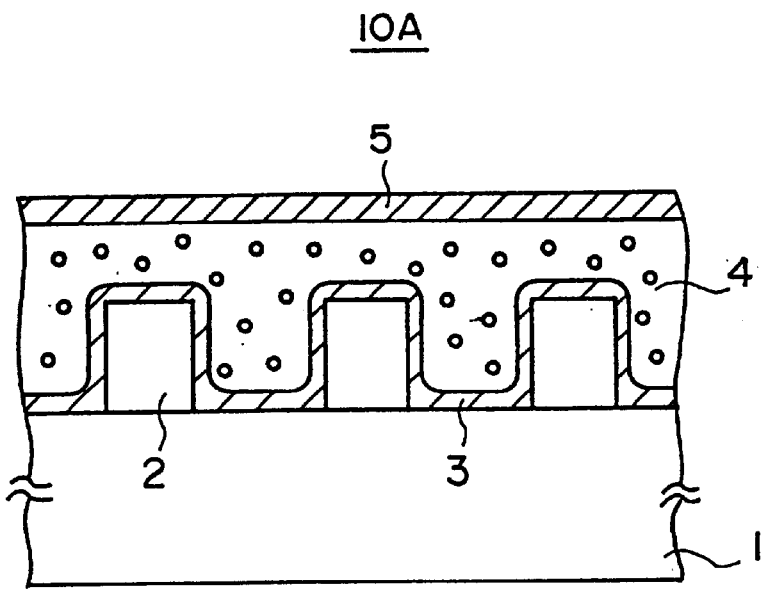
FIGS. 1A and 1B are diagrams showing examples of conventional multilayer interconnection structure.
Figure 1B:
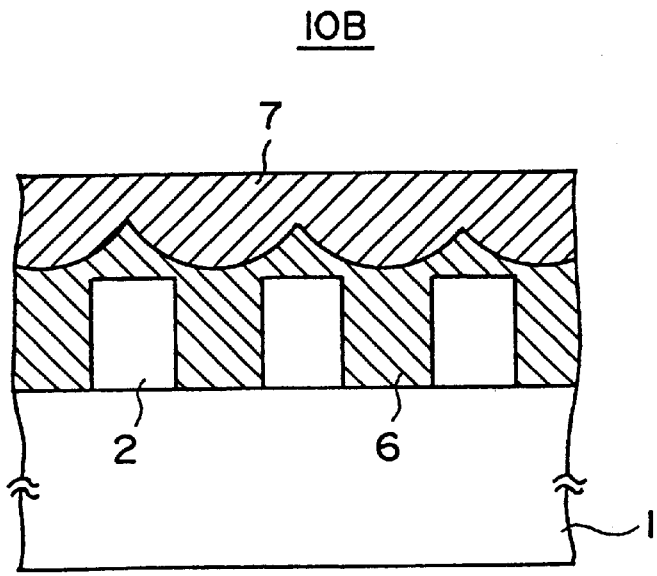
Figure 2:
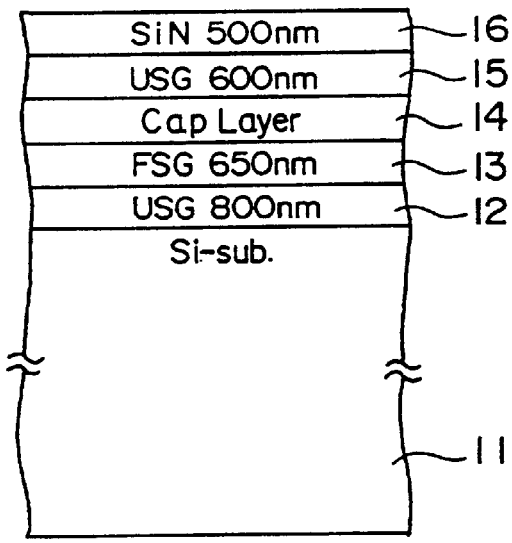
FIG. 2 is a diagram showing the construction of a test piece used in the experiments constituting the basis of the present invention.

In the investigation that forms the basis of the present invention, the inventor of the present invention conducted a series of experiments on a multilayer interconnection structure 20A shown in FIG. 2 and obtained a result represented in FIG. 3 as TABLE I.

In the experiments, a test piece 20A having a structure shown in FIG. 2 was subjected to a thermal annealing process in a nitrogen ($N_2$) atmosphere, and an examination was made on the test piece 20A thus annealed with regard to the status of exfoliation of the interlayer insulation film.

Referring to FIG. 2, the test piece 20A includes a Si substrate 11 and an undoped $SiO_2$ film 12 formed on the Si substrate 11 by a high-density plasma CVD process with a thickness of about 800 nm. The $SiO_2$ film 12 thus formed has a characteristic refractive index of about 1.46.

In the structure of FIG. 2, there is further formed a F-doped $SiO_2$ film 13 on the undoped $SiO_2$ film 12 with a thickness of about 650 nm, wherein the F-doped $SiO_2$ film 13 is formed by a high-density plasma CVD process while using $SiF_4$ as the source material and has a dielectric constant of about 3.4. During the deposition process of the F-doped $SiO_2$ film 13, no high-frequency biasing was applied to the substrate 11, as the use of such a high-frequency biasing during the deposition process of a F-doped $SiO_2$ film tends to cause a deterioration in the hygroscopicity of the F-doped $SiO_2$ film grown according to the high-density plasma CVD process. Because of this reason, it has been difficult to form the F-doped $SiO_2$ film 13 to have a dielectric constant lower than about 3.6.

Following TABLE II shows the actual condition used for forming the F-doped $SiO_2$ film 13, wherein it will be noted that the deposition of the $SiO_2$ film 13 was made by an ICP (induction-coupled plasma) plasma CVD apparatus.

TABLE II

| | |
|---|---|
| deposition apparatus | ICP plasma CVD |
| substrate temperature | 300–450° C. |
| process vessel pressure | 0.1–1.3 Pa |
| high-frequency power | 3.0–4.5 kW |
| plasma density | $\geq 10 \times 10^9$ cm$^{-3}$ |
| $SiH_4$ flow rate | 5–30 cc/min |
| $O_2$ flow rate | 200 cc/min |
| $SiF_4$ | 65–90 cc/min |

On the F-doped $SiO_2$ film 13, a cap layer 14 is formed by various methods, and an undoped $SiO_2$ film 15 similar to the undoped $SiO_2$ film 12 is formed on the cap layer 14 with the thickness of about 600 nm. Further, an SiN film 16 having a thickness of about 500 nm is formed on the $SiO_2$ film 15.

The specimen 20A thus formed was then subjected to a thermal annealing process at 400° C. in an $N_2$ atmosphere for various durations, for examination of exfoliation occurring therein.

EXPERIMENT A

Referring to TABLE I of FIG. 3, the experiment A represents the result for the case in which the cap layer 14 was formed by an $SiO_2$ film having a refractive index of 1.46, wherein the $SiO_2$ film for the experiment A was formed in a parallel-plate plasma CVD apparatus while using $SiH_4$, $N_2$ and $N_2O$ under the condition of TABLE 3 noted below.

TABLE III

| | |
|---|---|
| deposition apparatus | parallel-plate type |
| substrate temperature | 300–450° C. |
| process vessel pressure | 300–350 Pa |
| high-frequency power | 1.1 kW |
| $SiH_4$ flow rate | 300 cc/min |
| $N_2O$ flow rate | 9500 cc/min |
| $N_2$ flow rate | 1500 cc/min |

After the thermal annealing process conducted for the test piece 20A for the duration of 180 minutes, it was observed that there does occur an exfoliation in the SiN film 16. It should be noted that the SiN film 16 did not show such an exfoliation at the beginning of the annealing experiment.

EXPERIMENT B

TABLE I also shows the result of the experiment B, in which the cap layer 14 was formed of an $SiO_2$ film having a thickness of about 100 nm and a refractive index of about 1.49. It should be noted that the $SiO_2$ film of the experiment B was formed in a parallel-plate plasma CVD apparatus under the condition of TABLE IV below.

TABLE IV

| deposition apparatus | parallel-plate type |
|---|---|
| substrate temperature | 300–450° C. |
| process vessel pressure | 200–300 Pa |
| high-frequency power | 1.0 kW |
| $SiH_4$ flow rate | 350 cc/min |
| $N_2O$ flow rate | 9500 cc/min |
| $N_2$ flow rate | 1500 cc/min |

As represented in TABLE I, the experiment B did not show the exfoliation even when the test piece is subjected to the thermal annealing process for the duration of 180 minutes.

EXPERIMENT C

TABLE I also shows the result of the experiment C, in which the cap layer 14 was formed of an $SiO_2$ film having a thickness of about 100 nm and a refractive index of about 1.51. It should be noted that the $SiO_2$ film of the experiment C was formed in a parallel-plate plasma CVD apparatus under the condition of TABLE V below.

TABLE V

| deposition apparatus | parallel-plate type |
|---|---|
| substrate temperature | 350–400° C. |
| process vessel pressure | 200–300 Pa |
| high-frequency power | 0.4 kW |
| $SiH_4$ flow rate | 150 cc/min |
| $N_2O$ flow rate | 3800 cc/min |
| $N_2$ flow rate | 3800 cc/min |

As represented in TABLE I, the experiment C did not show the exfoliation even when the test piece was subjected to the thermal annealing process for the duration of 180 minutes.

EXPERIMENTS D–G

TABLE I also shows the result of the experiments D–G, in which the cap layer 14 of $SiO_2$ was formed by a plasma CVD process that uses TEOS as a source material with the thickness of 100–400 nm, under the condition represented in TABLE VI. The $SiO_2$ cap layer 14 thus formed had a refractive index of about 1.46.

TABLE VI

| deposition apparatus | parallel-plate type |
|---|---|
| substrate temperature | 300–400° C. |
| process vessel pressure | 250–400 Pa |
| high-frequency power | 0.4 kW |
| TEOS flow rate | 2.1 cc/min |
| $O_2$ flow rate | 9500 cc/min |

As represented in TABLE I, the experiments D–G showed an exfoliation of the SiN film 16 after 30 minutes from the start of the thermal annealing process.

EXPERIMENTS H–I

TABLE I also shows the result of the experiments H–I in which the cap layer 14 was formed of a composite film of an $SiO_2$ film and an SiON film, wherein the $SiO_2$ film was formed by the plasma CVD process that uses TEOS as the source material, while the SiON film was formed by a plasma CVD process under the condition noted in TABLE VII below. The SiON film thus formed had a refractive index of about 1.58.

TABLE VII

| deposition apparatus | parallel-plate type |
|---|---|
| substrate temperature | 300–350° C. |
| process vessel pressure | 350–450 Pa |
| high-frequency power | 220–250 W |
| $SiH_4$ flow rate | 40 cc/min |
| $N_2O$ flow rate | 170 cc/min |
| $N_2$ flow rate | 2000 cc/min |

As represented in TABLE I, the experiments H–I showed an exfoliation of the SiN film 16 after 90 minutes from the start of the thermal annealing process.

EXPERIMENTS J–L

TABLE I also shows the result of the experiments J–L in which the cap layer 14 was formed of a composite film of an $SiO_2$ film and an SiON film, wherein the $SiO_2$ film was formed with a thickness of about 200 nm either by a plasma CVD process conducted under the condition of TABLE III or by a plasma CVD process under the condition of TABLE VI while using TEOS as the source material. In any of these cases, the $SiO_2$ film has a refractive index of about 1.46. The SiON film, on the other hand, was formed by a plasma CVD process under the condition noted in TABLE VIII below. The SiON film thus formed had a refractive index of about 1.65.

TABLE VIII

| deposition apparatus | parallel-plate type |
|---|---|
| substrate temperature | 300–350° C. |
| process vessel pressure | 350–450 Pa |
| high-frequency power | 220–250 W |
| $SiH_4$ flow rate | 40 cc/min |
| $N_2O$ flow rate | 170 cc/min |
| $N_2$ flow rate | 2000 cc/min |

As represented in TABLE I, the experiments J–L showed an exfoliation of the SiN film 16 after 180 minutes from the start of the thermal annealing process.

Figure 4:
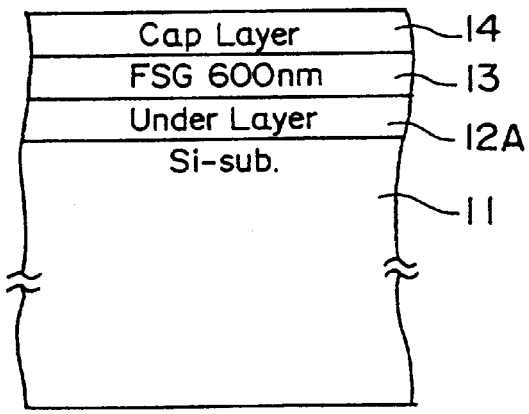
FIG. 4 is a diagram showing the construction of another test piece.

Further, the inventor of the present invention conducted a similar thermal annealing experiments for a test piece 20B having a construction shown in FIG. 4. In FIG. 4, those parts corresponding to the parts described previously are designated by the same reference numerals and the description thereof will be omitted.

Referring to FIG. 4, the Si substrate 11 is covered with an underlying layer 12A corresponding to the undoped $SiO_2$ film 12 of FIG. 2, and the F-doped $SiO_2$ film 13 is formed on the underlying layer 12A with a thickness of about 600 nm under the condition represented in TABLE II. Further, the F-doped $SiO_2$ film 13 is covered with the cap layer 14.

TABLE IX represented in FIG. 5 shows the result of the annealing experiments conducted on the test piece 20B of FIG. 4, wherein the annealing experiments were made at about 400° C. in an $N_2$ atmosphere.

Referring to TABLE IX, the experiment M represents the case in which an undoped $SiO_2$ film is formed for the underlying layer 12A by a plasma CVD process with a thickness of about 500 nm, under the condition explained previously with reference to TABLE III. The F-doped $SiO_2$ film 13 was then formed on the layer 12A under the condition of TABLE VI with a thickness of about 600 nm, and the cap layer 14 of SiN was formed on the F-doped $SiO_2$ film 13 with a thickness of about 30 nm by a plasma CVD process. The SiN film constituting the cap layer 14 had a refractive index of about 2.00.

In the experiment N, an $SiO_2$ film having a refractive index of about 1.49 was formed on the F-doped $SiO_2$ film 13 as the cap layer 14 with a thickness of about 100 nm, under the condition explained with reference to TABLE IV. The $SiO_2$ film thus formed was further covered by an SiN film formed under the condition of the experiment M with a thickness of about 30 nm.

In the experiment O, on the other hand, the underlying layer 12A and the cap layer 14 were formed of an SiN film, wherein the SiN film was formed with a a thickness of about 30 nm by a plasma CVD process.

The result of TABLE IX shows that there occurs an exfoliation in the experiment M after a thermal annealing process conducted for 90 minutes. In the experiments N and O, no exfoliation was observed.

Summarizing above, in the experiments of TABLE I conducted on the specimen 20A, it was observed that exfoliation occurred always in the SiN film 16 which has a dense texture, wherein this result is interpreted such that the F-doped $SiO_2$ film 13 releases F ions when the thermal annealing process is conducted and that the F ions thus released are accumulated under the dense SiN film 16. On the other hand, the result of the experiments B and C of TABLE I or the result of the experiment N of TABLE IX clearly shows that the problem of exfoliation is successfully avoided when a high-refractive index $SiO_2$ film is formed adjacent to the F-doped $SiO_2$ film 13 as the cap layer 14. This suggests that the F ions released from the F-doped $SiO_2$ film 13 are captured by the high-refractive index $SiO_2$ cap layer 14.

Figure 6:
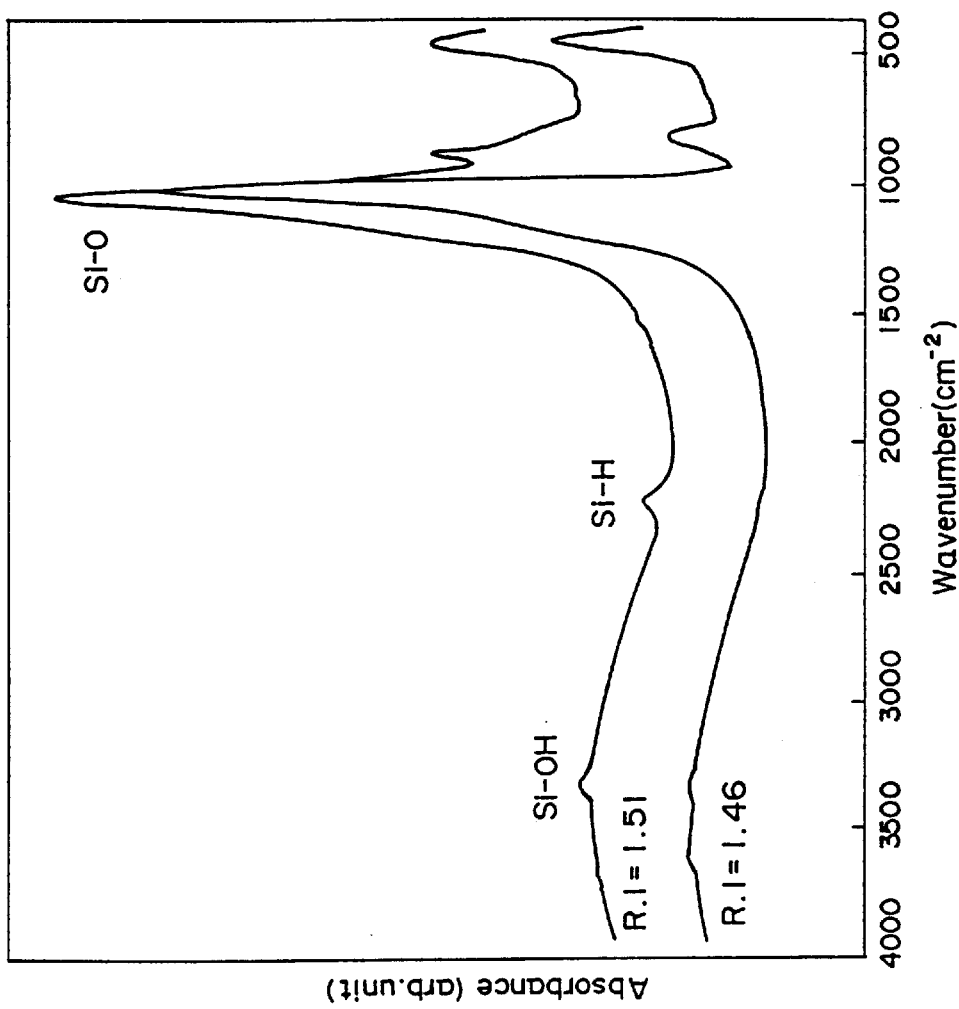
FIG. 6 is an FTIR spectrum of various $SiO_2$ films used in the experiment.

FIG. 6 shows the FTIR (Fourier transform infrared) absorption spectrum observed for a plasma-CVD $SiO_2$ film thus formed for the cap layer 14 with a refractive index of 1.46 and for a plasma-CVD $SiO_2$ film thus formed with a refractive index of 1.51.

Referring to FIG. 6, it can be seen that there appears a strong absorption peak corresponding to the Si—O bond at the wavenumber of about $1100$ $cm^{-1}$ for any of the $SiO_2$ film having the refractive index of 1.46 and the $SiO_2$ film having the refractive index of 1.51. On the other hand, it should be noted that the $SiO_2$ film having the refractive index of 1.51 shows the existence of an absorption peak at the wavenumber of about $2200$ $cm^{-1}$ corresponding to the Si—H bond and further an absorption peak at the wavenumber of about $3400$ $cm^{-1}$ corresponding to the Si—OH bond. In other words, the result of FIG. 6 indicates that the high-refractive index $SiO_2$ film contains therein an excessive amount of Si.

From the foregoing result of the FTIR spectrum of FIG. 6, it is interpreted that, in the experiment B or C of TABLE I or in the experiment N of TABLE IX, the excessive Si ions in the high-refractive index $SiO_2$ film capture the F ions that are released from the F-doped $SiO_2$ film. In the spectrum of FIG. 6, it should also be noted that there is a shift in the absorption peak observed at the wavenumber of about $800$ $cm^{-1}$ in the $SiO_2$ film having the refractive index of 1.46, such that the foregoing absorption peak is shifted to the wavenumber of about $900$ $cm^{-1}$ in the $SiO_2$ film having the refractive index of 1.51.

Thus, according to the present invention, it becomes possible to avoid the problem of exfoliation of the interlayer insulation film or the passivation film constituting a multi-layer interconnection structure, by disposing a high-refractive index $SiO_2$ film containing excess amount of Si adjacent to the F-doped $SiO_2$ film and by causing the high-refractive index $SiO_2$ film to absorb the F ions released from the F-doped $SiO_2$ film.

FIRST EMBODIMENT

Figure 7:
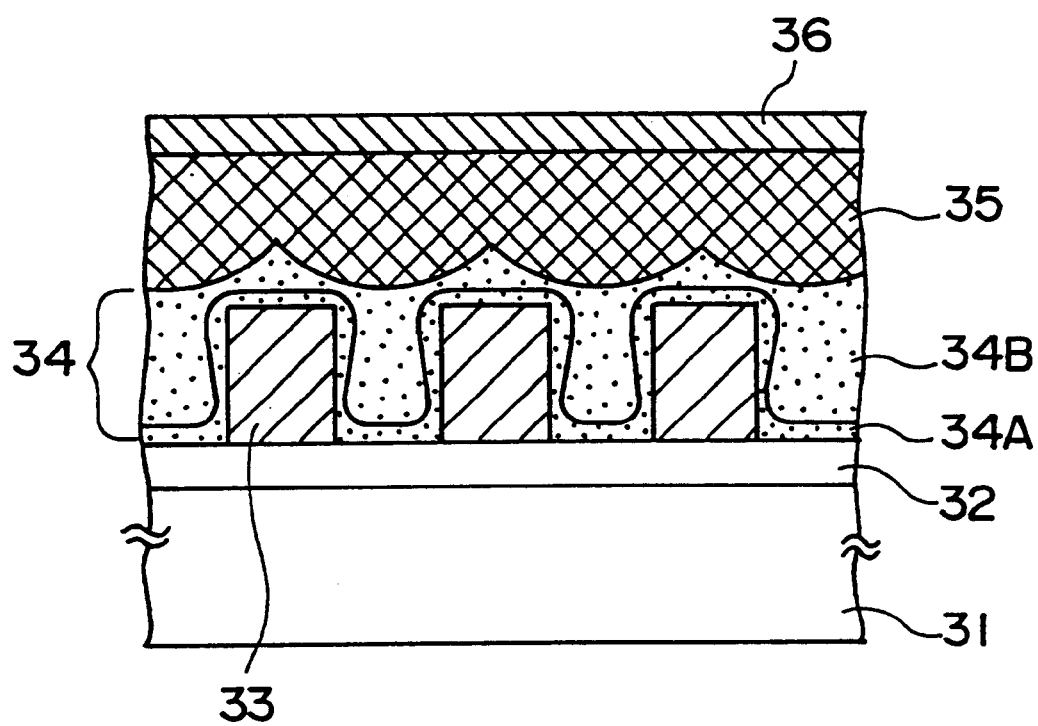
FIG. 7 is a diagram showing the construction of a semiconductor device according to a first embodiment of the present invention.

FIG. 7 shows the construction of a semiconductor device 30 having a multilayer interconnection structure according to a first embodiment of the present invention.

Referring to FIG. 7, the semiconductor device 30 includes a Si substrate 31 and a CVD-$SiO_2$ film 32 formed on the substrate 31 so as to cover the active devices such as MOS transistors formed on the Si substrate 31.

The CVD-$SiO_2$ film 32 carries thereon an interconnection pattern 33 of Al or an Al-alloy, wherein the interconnection pattern 33 is covered with an F-doped, low-dielectric $SiO_2$ film 34 formed by an ICP plasma CVD apparatus 40 to be described with reference to FIG. 8. The $SiO_2$ film 34 typically has a dielectric constant in the range of 3.4–3.5.

Figure 8:
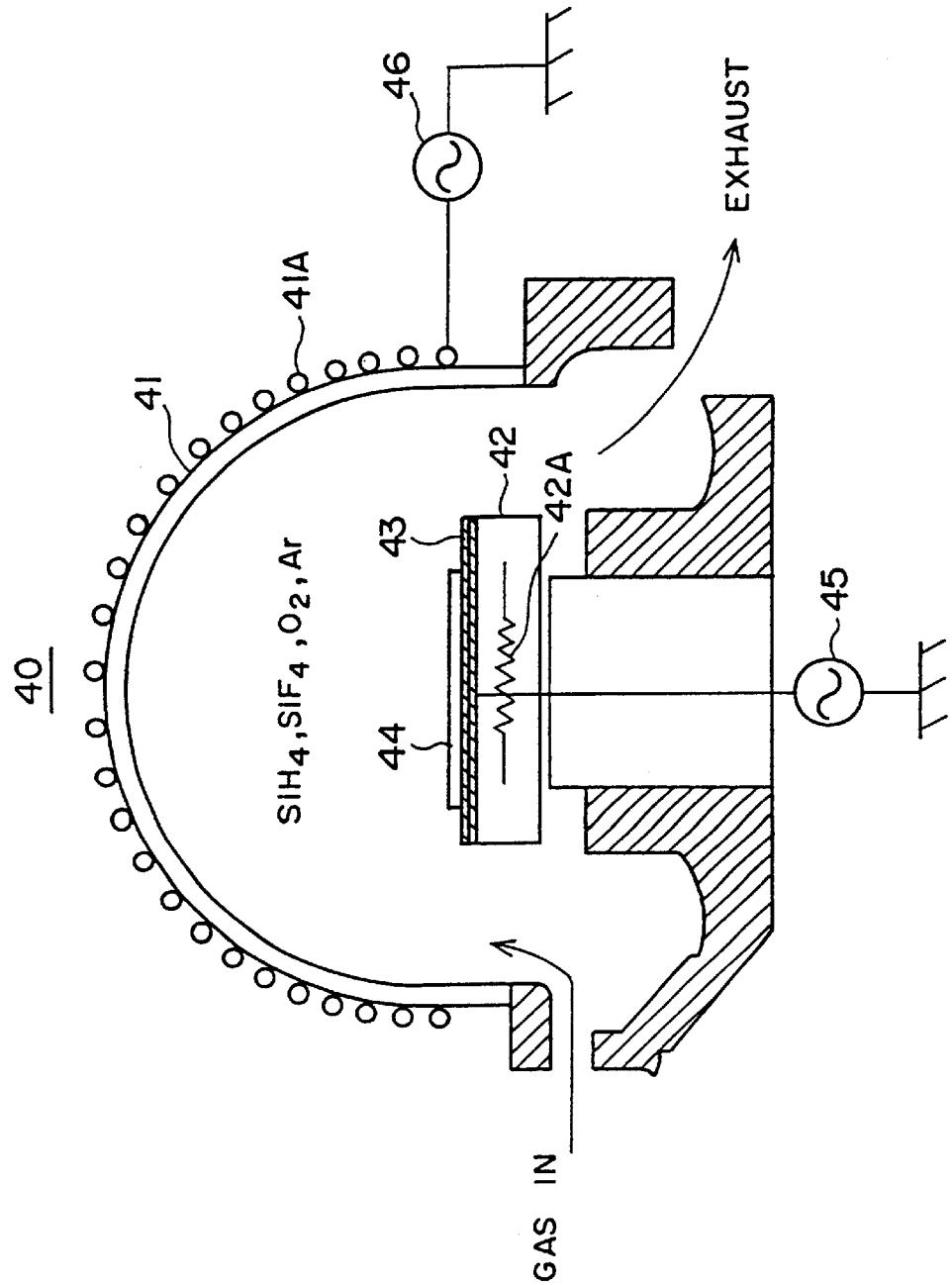
FIG. 8 is a diagram showing the construction of a plasma CVD apparatus used in the present invention for forming a F-doped, low-dielectric $SiO_2$ film.

Referring to FIG. 8, the ICP plasma CVD apparatus 40 includes a process vessel 41 to which various gaseous source materials such as $SiH_4$, $SiF_4$, $O_2$, and the like, are introduced together with a carrier gas of Ar, and the like, wherein the process vessel 41 includes therein a stage 42 adapted to hold a substrate 44 via an electrostatic chuck 43. By introducing the foregoing gaseous source materials such as $SiH_4$, $SiF_4$ or $O_2$ into the process vessel 41 and by energizing the substrate 44 by a high-frequency power source 45, and further by energizing a coil 41A outside the process vessel 41 simultaneously by using another high-frequency power source 46, a high-density plasma is formed in the process vessel 41. It should be noted that the stage 42 also includes a cooling mechanism 42A for controlling the temperature of the substrate.

In the present embodiment, deposition of an $SiO_2$ film is conducted after the step of forming the interconnection pattern 33 by using the CVD apparatus 40 of FIG. 8 under the condition of TABLE II. Thereby, there is formed a F-doped $SiO_2$ film 34A containing therein F with the amount of about 12 atomic percent such that the F-doped $SiO_2$ film 34A covers the interconnection pattern 33 with a thickness of typically about 100 nm. By avoiding the use of substrate biasing in the step of forming the F-doped $SiO_2$ film 34A, the F-doped $SiO_2$ film 34A is formed to have little hygroscopicity while simultaneously satisfying the request of high F-concentration and a small dielectric constant, as low as about 3.4.

As the F-doped $SiO_2$ film 34A is formed without a substrate biasing, the step coverage over the interconnection pattern 33 by the $SiO_2$ film 34 becomes inevitably poor. In view of the poor step coverage of the F-doped $SiO_2$ film 34A, the present embodiment forms another F-doped $SiO_2$ film 34B on the $SiO_2$ film 34A by using the same ICP plasma CVD apparatus 40 of FIG. 8 but with a substrate biasing. Thus, during the deposition of the F-doped $SiO_2$ film 34A, the high-frequency power source 45 is activated with a power of 1200 W. Typically, the F-doped $SiO_2$ film 34B is formed with a thickness of about 800 nm.

During the deposition of the $SiO_2$ film 34B, the supply of $SiF_4$ is reduced slightly such that the $SiO_2$ film 34B thus formed contains F with a concentration of about 8%. By controlling the F-content in the $SiO_2$ film within this level, it is possible to obtain a stable film quality and low hygroscopicity even when the $SiO_2$ film is formed under the presence of the substrate biasing. While it is true that the $SiO_2$ film 34B has a dielectric constant slightly larger than that of the $SiO_2$ film 34A because of the decreased F-content, the stray capacitance of the interlayer insulation film is still suppressed effectively, as the $SiO_2$ film 34B does not make a direct contact with the interconnection pattern 33.

In the structure 30 of FIG. 7, the interlayer insulation film 34B thus formed is further covered with a high-refractive index $SiO_2$ film 35 by forming the $SiO_2$ film in the parallel-plate plasma CVD under the condition of TABLE IV to have a thickness of typically about 100 nm. It should be noted that the $SiO_2$ film 35 thus formed has a refractive index of 1.49 or higher and has a Si-enriched composition with respect to the stoichiometry composition of $SiO_2$. Further, an SiN film 36 having a refractive index of about 2.0 is formed on the $SiO_2$ film 35 by the same parallel-plate plasma CVD apparatus.

In the multilayer interconnection structure having such a structure, it should be noted that the F ions released from the F-doped $SiO_2$ film 34A or 34B are captured by the high-refractive index $SiO_2$ film 35 as noted previously. Thereby, the problem of exfoliation of the SiN film 36, an example of which can be seen in the experiment B or C of TABLE I or in the experiment N of TABLE IX, is effectively suppressed. It should be noted that an $SiO_2$ film having a refractive index of 1.48 or higher may be used for the high-refractive index $SiO_2$ film 35.

SECOND EMBODIMENT

Figure 9:
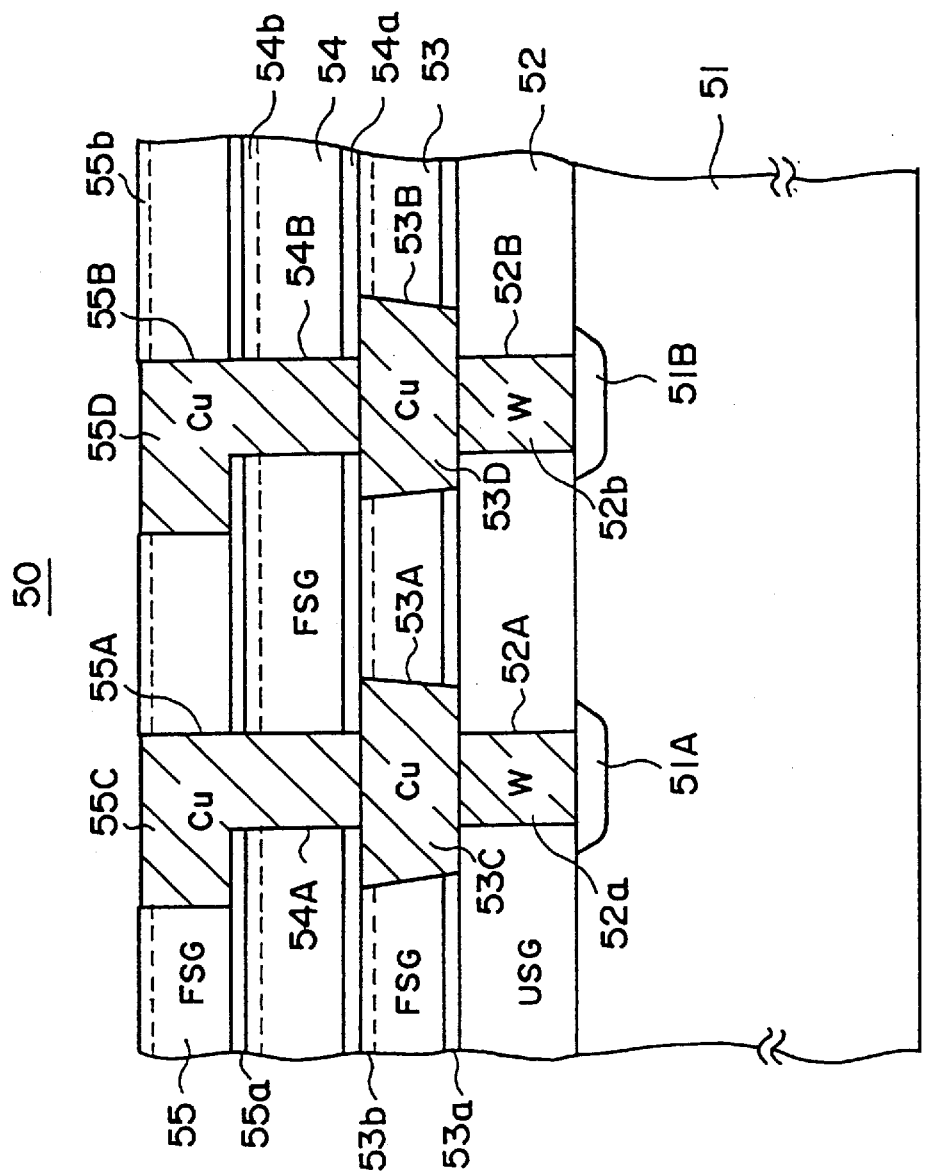
FIG. 9 is a diagram showing the construction of a semiconductor device according to a second embodiment of the present invention.

FIG. 9 shows the construction of a semiconductor device 50 having a multilayer interconnection structure formed by a dual damascene process according to a second embodiment of the present invention.

Referring to FIG. 9, the semiconductor device 50 is constructed on a Si substrate 51 including diffusion regions 51A and 51B, wherein the substrate 51 is covered with an interlayer insulation film 52 of an undoped $SiO_2$ film corresponding to the $SiO_2$ film 12 of the structure 20A of FIG. 2, and the interlayer insulation film 52 is formed with contact holes 52A and 52B exposing the diffusion regions 51A and 51B respectively. Further, there is formed a low-dielectric interlayer insulation film 53 of an F-doped $SiO_2$ film on th interlayer insulation film 52, wherein the foregoing low-dielectric interlayer insulation film 53 is formed with interconnection grooves 53A and 53B respectively exposing the contact holes 52A and 52B.

The contact holes 52A and 52B are filled with W plugs 52a and 52b respectively, while the interconnection grooves 53A and 53B are filled respectively with Cu interconnection patterns 53C and 53D. Between the interlayer insulation film 53 and the underlying interlayer insulation film 52, there is formed an SiN film 53a used as an etching stopper, and the interlayer insulation film 53 is covered by a high-refractive index $SiO_2$ film 53b corresponding to the high-refractive index $SiO_2$ film 35 and having a refractive index of preferably 1.49 or higher.

It should be noted that the W plugs 52a and 52b are formed by depositing a W layer on the interlayer insulation film 52 so as to fill the contact holes 52A and 52B, followed by a CMP process for removing any residual W layer remaining on the top surface of the interlayer insulation film 52. Similarly, the Cu interconnection patterns 53C and 53D are formed by depositing a Cu layer on the interlayer insulation film 53, more precisely on the high-refractive index $SiO_2$ film 53b so as to fill the interconnection grooves 53A and 53B, followed by a CMP process to remove the same from the top surface of the $SiO_2$ film 53b.

On the interlayer insulation film 53, more precisely on the high-refractive index $SiO_2$ film 53b, there is formed an interlayer insulation film 54 of F-doped $SiO_2$, with an SiN etching stopper film 54a interposed between the interlayer insulation film and the high-refractive index $SiO_2$ film 53b. Further, the interlayer insulation film 54 thus formed is covered with a high-refractive index $SiO_2$ film 54b similar to the $SiO_2$ film 53b. On the interlayer insulation film 54, there is further provided an interlayer insulation film 55 of F-doped $SiO_2$, with the high-refractive index $SiO_2$ film 54b and an SiN etching stopper film 55a interposed between the interlayer insulation film 55 and the interlayer insulation film 54. Further, the interlayer insulation film 55 is covered by a high-refractive index $SiO_2$ film 55b similar to the high-refractive index $SiO_2$ film 53b or 54b.

In the interlayer insulation film 55 and the high-refractive index $SiO_2$ film 55b, there are formed interconnection grooves 55A and 55B while using the SiN film 55a as an etching stopper. Further, contact holes 54A and 54B are formed in the interlayer insulation film 54 and further in the high-refractive index $SiO_2$ film 55B by a dry etching process that is conducted while using the SiN film 55a as a hard mask. The contact holes 54A and 54B are formed so as to expose the SiN film 54a, wherein the SiN film 54a is further subjected to a dry etching process to expose the Cu interconnection patterns 53C and 53D at the contact holes 54A and 54B respectively.

The interlayer insulation film 55, more precisely the high-refractive index $SiO_2$ film 55b is covered by a Cu layer deposited so as to fill the interconnection grooves 55A and 55B and the contact holes 54A and 54B, followed by a CMP process to remove the residual Cu layer remaining on the top surface of the high-refractive index $SiO_2$ film 55b. As a result of the CMP process, Cu interconnection patterns 55C and 55D are formed so as to fill the interconnection grooves 55A and 55B and so as to make a contact with the interconnection pattern 53A or 53B via the contact hole 54A or 54B.

In the present embodiment, too, a high-refractive index $SiO_2$ film such as the $SiO_2$ film 53b or 54b is formed adjacent to the F-doped low-dielectric $SiO_2$ film such as the $SiO_2$ film 53, 54 or 55 so that the high-refractive index $SiO_2$ film 53b or 54b is interposed between the corresponding SiN film 54a or 55a. Thereby, the F ions released from the F-doped $SiO_2$ film 53 or 54 is captured by the high-refractive index $SiO_2$ film 53b or 54b, and the problem of accumulation of F under the SiN film 54a or 55a is successfully eliminated. Associated with the elimination of the problem of accumulation of F, the semiconductor device 50 shows excellent reliability.

The semiconductor device 50 may be any of a logic integrated circuit and a memory integrated circuit such as a DRAM.

THIRD EMBODIMENT

Figure 10:
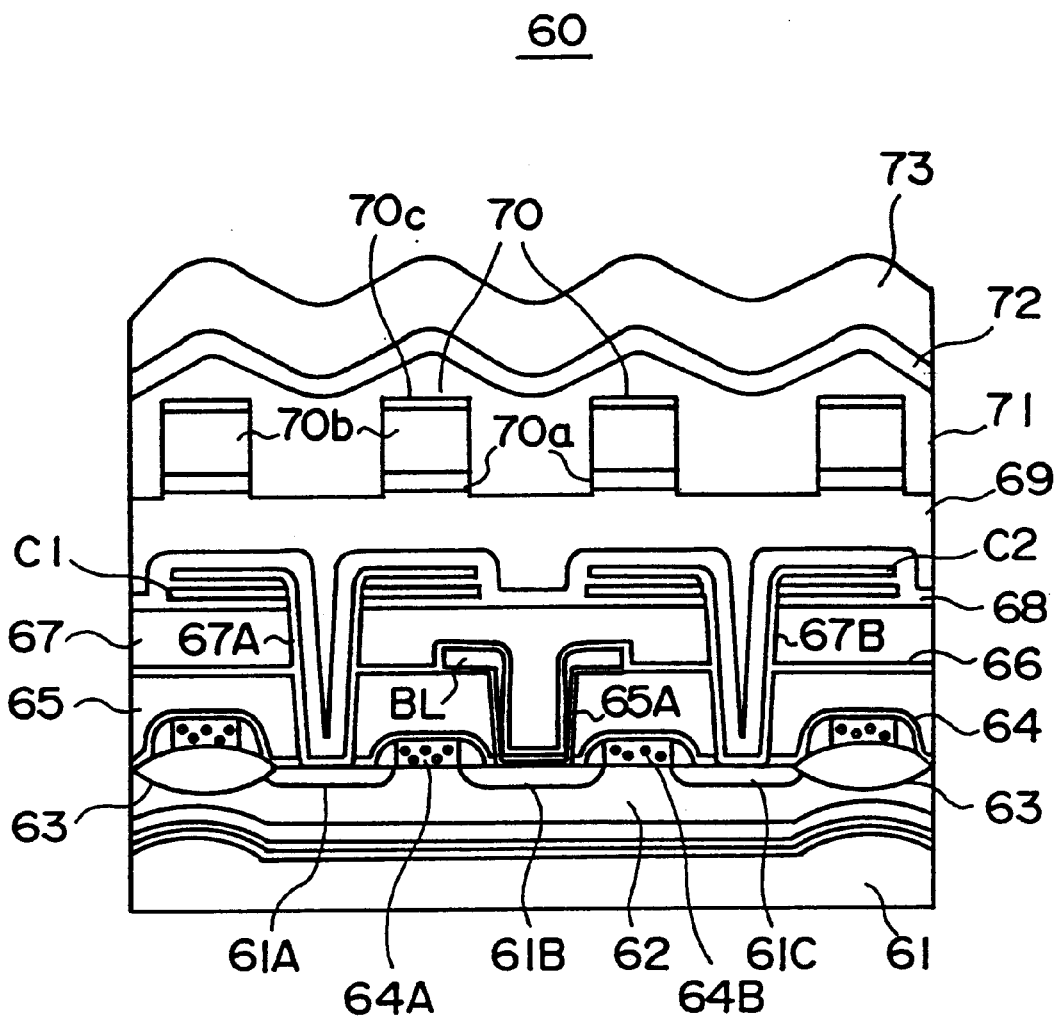
FIG. 10 is a diagram showing the construction of a semiconductor device according to a third embodiment of the present invention.

FIG. 10 shows the construction of a DRAM 60 according to a third embodiment of the present invention.

Referring to FIG. 8, the DRAM 60 is constructed on a Si substrate 61 formed with a p-type well 62, wherein the Si substrate 61 is also formed with a field oxide film 63 defining an active region. In the Si substrate 61, there are formed diffusion regions 61A–61C of the n$^+$-type in correspondence to the active region, and a gate electrode 64A is formed on the substrate 61 so as to cover the channel region formed in the active region between the diffusion region 61A and the diffusion region 61B, with a gate insulation film (not shown) interposed between the substrate 61 and the gate electrode 64A. Similarly, another gate electrode 64B is formed on the substrate 61 so as to cover the channel region formed in the active region between the diffusion region 61B and the diffusion region 61C, with a gate insulation film (not shown) interposed between the substrate 61 and the gate electrode 64B. Further, a word line WL similar to the gate electrode 64A or 64B extends over the field oxide film 63.

Each of the gate electrodes 64A and 64B, and also the word line WL, has a pair of side-wall insulation films on the respective side walls thereof, and is further covered by a thin insulation film 64 of SiN, and the like. Further, the insulation film 64 is covered by a planarizing insulation film 65 of CVD-SiO$_2$, and the like, wherein the planarizing insulation film 65 is formed with a contact hole 65A exposing the diffusion region 61B. Further, there is formed a bit line electrode BL on the planarizing insulation film 65 by W or polysilicon, such that the bit line electrode BL makes a contact with the diffusion region 61B at the contact hole 65A.

It should be noted that the bit line electrode BL is covered by a thin insulation film 66 of SiN, and the like, and a planarizing insulation film 67 of a CVD-SiO$_2$ film, and the like, is formed on the insulation film 66. Further, the planarizing insulation film 67 is formed with contact holes 67A and 67B so as to expose the diffusion regions 61A and 61C, and memory cell capacitors C1 and C2 of the stacked-fin type are formed respectively in the contact holes 67A and 67B.

Each of the stacked-fin type capacitors C1 and C2 includes a polysilicon storage electrode that makes a contact with the diffusion region 61A or 61C at the contact hole 67A or 67B, and a capacitor insulation film covering the polysilicon storage electrode. Further, a polysilicon cell plate 68 covers the capacitor insulation film. The polysilicon cell plate 68, in turn, is covered by a planarizing interlayer insulation film 69.

On the planarizing interlayer insulation film 69, there is formed an interconnection pattern 70, wherein the interconnection pattern 70 includes a barrier layer 70a having a Ti/TiN structure formed on the interlayer insulation film 69, a conductor pattern 70b of Al or an Al-alloy formed on the barrier layer 70a, and an anti-reflection coating (ARC) 70c of SiON, and the like, formed on the conductor pattern 70b. The interconnection pattern 70 is covered by an interlayer insulation film 71 of a F-doped, low-dielectric SiO$_2$ film formed on the planarizing interlayer insulation film 69, wherein the interlayer insulation film 71 may contain F with a concentration of about 12 atomic percent and may have a dielectric constant of about 3.4.

Further, in the DRAM 60 of FIG. 8, there is formed a high-refractive index SiO$_2$ film 72 having a refractive index larger than about 1.48, preferably larger than about 1.49, on the interlayer insulation film 71, and a passivation film 73 of SiN is formed on the foregoing high-refractive index SiO$_2$ film 72.

In the present embodiment, the accumulation of F under the passivation film 73 is minimized by interposing the high-refractive index SiO$_2$ film 72 between the F-doped, low-dielectric interlayer insulation film 71 and the dense SiN passivation film 73. Thereby, the exfoliation of the SiN passivation film 73 is effectively avoided.

FOURTH EMBODIMENT

Figure 11:
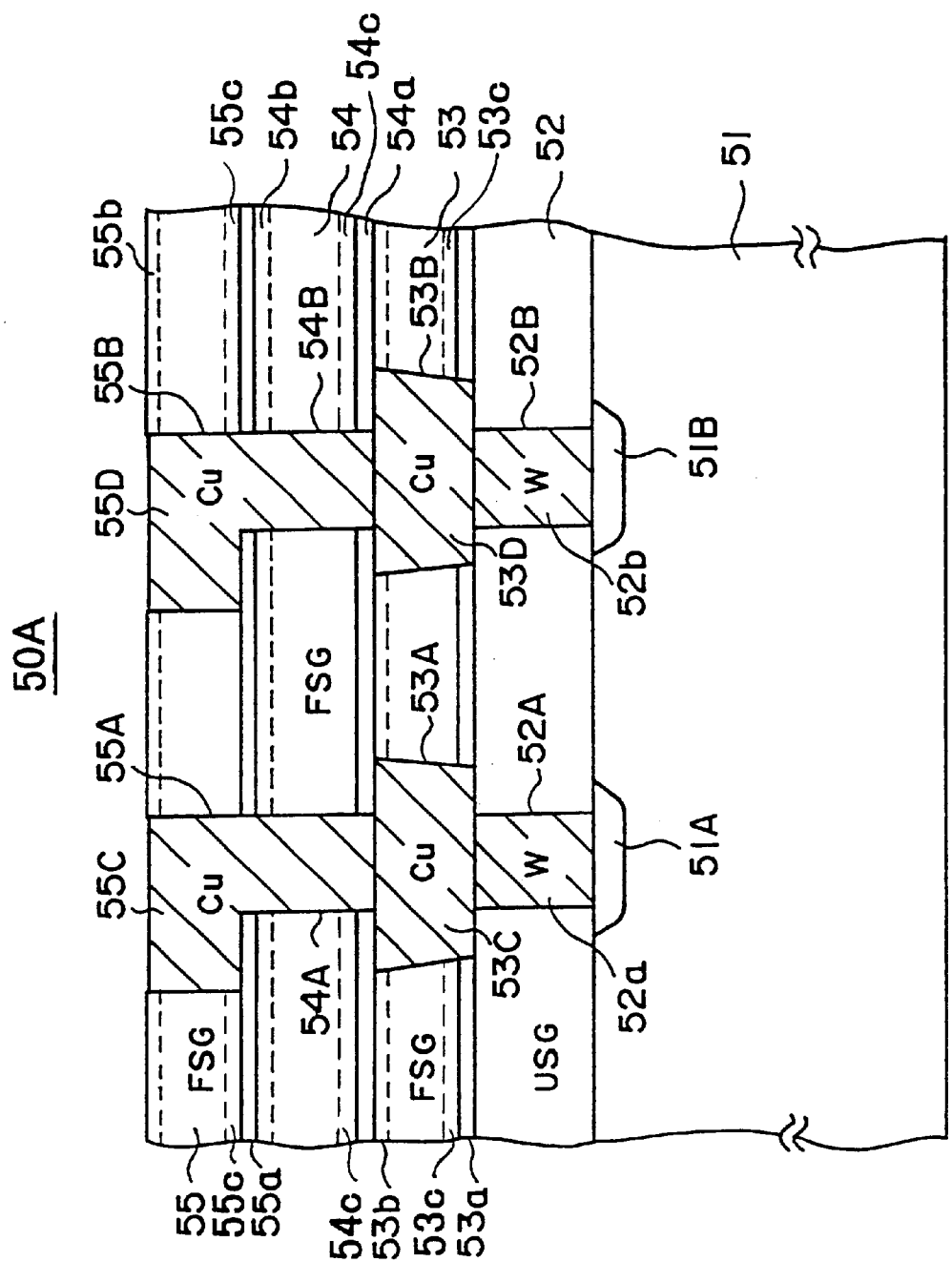
FIG. 11 is a diagram showing the construction of a semiconductor device according to a fourth embodiment of the present invention.

FIG. 11 shows the construction of a semiconductor device 50A according to a fourth embodiment of the present invention, wherein those parts corresponding to the parts described previously are designated by the same reference numerals and the description thereof will be omitted.

Referring to FIG. 11, the semiconductor device 50A is a modification of the semiconductor device 50 of FIG. 9 in that each of the F-doped SiO$_2$ films 53, 54 and 55 has also an additional high-refractive index SiO$_2$ film 53c, 54c or 55c, such that the additional high-refractive index SiO$_2$ film is formed at the bottom part of the F-doped SiO$_2$ film so as to intervene between the F-doped SiO$_2$ film and the SiN etching stopper layer thereon. For example, the additional high-refractive index SiO$_2$ film 53c is interposed between the F-doped SiO$_2$ film 53 and the SiN film 53a thereunder, the additional high-refractive index SiO$_2$ film 54c is interposed between the F-doped SiO$_2$ film 54 and the underlying SiN etching stopper layer 54a.

Thereby the SiN film 54a or 55a is sandwiched by a pair of high-refractive index SiO$_2$ film, such as the SiO$_2$ film 53b and the SiO$_2$ film 54c, and it becomes possible to interrupt the migration of the F ions to the SiN film from both the upward direction and the downward direction. Thereby, the accumulation of the F ions adjacent to the SiN film is effectively eliminated.

FIFTH EMBODIMENT

Figure 12:
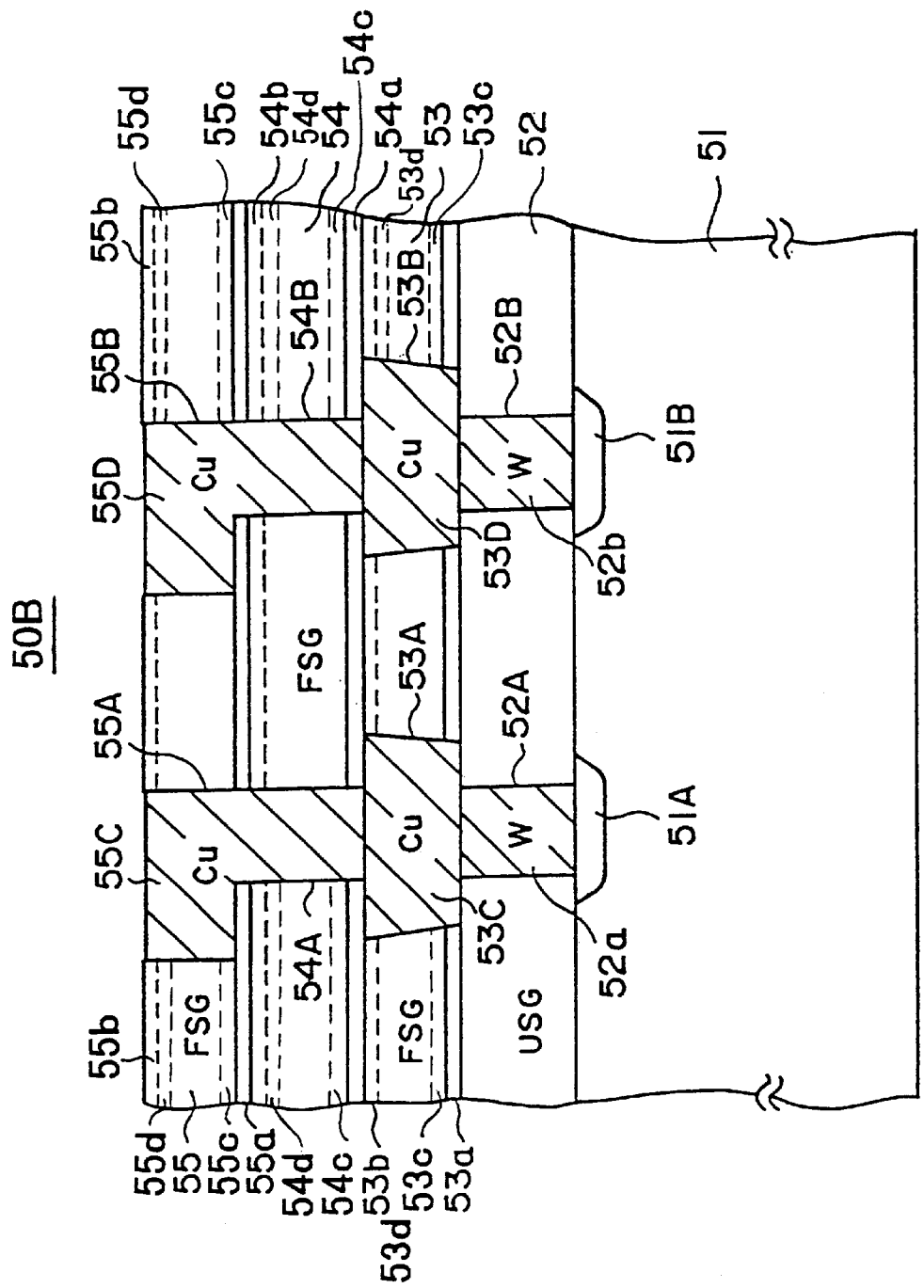
FIG. 12 is a diagram showing the construction of a semiconductor device according to a fifth embodiment of the present invention.

FIG. 12 shows the construction of a semiconductor device 50B according to a fifth embodiment of the present invention, wherein those parts corresponding to the parts described previously are designated by the same reference numerals and the description thereof will be omitted.

Referring to FIG. 12, the semiconductor device 50B is a modification of the semiconductor device 50A of FIG. 11 in that there is added a further extra high-refractive index SiO$_2$ film between the F-doped SiO$_2$ film and the high-refractive index SiO$_2$ film at the top part of the F-doped SiO$_2$ film, such as an SiO$_2$ film 53d, 54d or 55d. For example, the high-refractive index SiO$_2$ film 53d is interposed between the F-doped SiO$_2$ film 53 and the high-refractive index SiO$_2$ film 53b formed at the top part of the F-doped SiO$_2$ film 53.

By providing such an additional high-refractive index SiO$_2$ film 53d, it becomes possible to completely block the migration of the F ions to the SiN film 54a from the underlying F-doped SiO$_2$ film 53. A similar effect is obtained for the additional high-refractive index SiO$_2$ films 54d and 55d.

Further, the present invention is not limited to the embodiments described heretofore, but various variations and modifications may be made without departing from the scope of the invention.

What is claimed is:

1. A semiconductor device, comprising:
    a substrate;
    an interconnection pattern formed above said substrate;
    a F-doped interlayer insulation film covering said interconnection pattern; and
    a high-refractive index insulation film having a refractive index higher than a refractive index of said F-doped interlayer insulation film, said high-refractive index insulation film being disposed at least one of a top side and a bottom side of said F-doped interlayer insulation film.

2. A semiconductor device as claimed in claim 1, wherein said high-refractive index insulation film comprises an SiO$_2$ film containing therein an excess amount of Si.

3. A semiconductor device as claimed in claim 1, wherein said high-refractive index insulation film has a refractive index equal to or larger than about 1.48.

4. A semiconductor device as claimed in claim 1, wherein said interlayer insulation film is covered by a passivation film.

5. A semiconductor device as claimed in claim 1, further including another high-refractive index insulation film adjacent to said high-refractive index insulation film, said another high-refractive index insulation film having a refractive index higher than said refractive index of said high-refractive index insulation film.

6. A semiconductor device as claimed in claim 1, wherein said F-doped interlayer insulation film includes a first layer having a first concentration level of F and a second layer formed on said first layer and having a second concentration level of F, said second concentration level being smaller than said first concentration level.

7. A semiconductor device as claimed in claim 3, wherein said high-refractive index insulation film has a refractive index equal to or larger than about 1.49.

* * * * *